(12) United States Patent
Monzel

(10) Patent No.: US 6,667,912 B1
(45) Date of Patent: Dec. 23, 2003

(54) TIMING SCHEME FOR SEMICONDUCTOR MEMORY DEVICES

(75) Inventor: Carl A. Monzel, Lakeview, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/078,313

(22) Filed: Feb. 18, 2002

(51) Int. Cl.[7] ............................. G11C 7/00; G11C 7/02
(52) U.S. Cl. .................. 365/189.07; 365/193; 365/196; 365/207
(58) Field of Search ...................... 365/189.07, 193, 365/196, 207

(56) References Cited

U.S. PATENT DOCUMENTS

| | | | | |
|---|---|---|---|---|
| 6,104,653 A | * | 8/2000 | Proebsting | 365/203 |
| 6,414,898 B1 | * | 7/2002 | Chien | 365/230.06 |
| 6,417,697 B2 | * | 7/2002 | Afghahi et al. | 326/86 |
| 2003/0021159 A1 | * | 1/2003 | Issa | 365/189.02 |
| 2003/0035336 A1 | * | 2/2003 | Terzioglu et al. | 365/230.03 |

* cited by examiner

Primary Examiner—David Nelms
Assistant Examiner—Ly Duy Pham
(74) Attorney, Agent, or Firm—Maginot, Moore & Bowman

(57) ABSTRACT

A semiconductor memory device includes at least one memory cell for storing digital data. A local sense amplifier is operably coupled to the at least one memory cell for receiving a first signal representative of the digital data stored in the at least one memory cell, and outputting a second signal representative of the received first signal in response to a first strobe signal. A global sense amplifier is operably coupled to the local sense amplifier for receiving the second signal, and outputting a third signal representative of the received second signal in response to a second strobe signal. Dummy circuitry is provided for enabling generation of the first and second strobe signals.

12 Claims, 6 Drawing Sheets

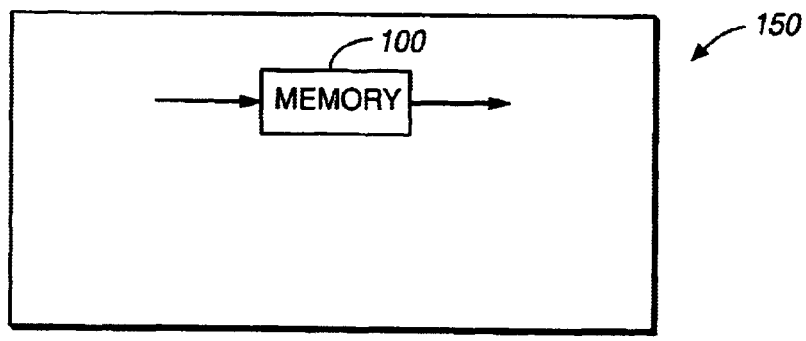
FIG._1
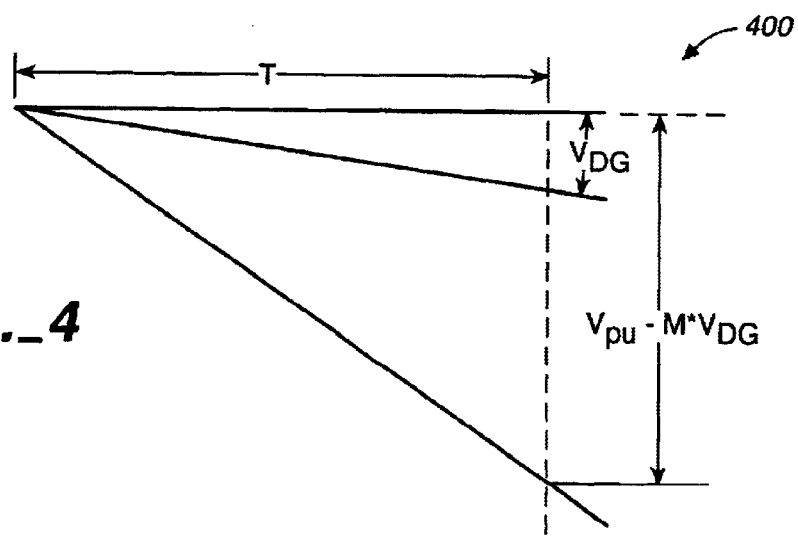
FIG._4
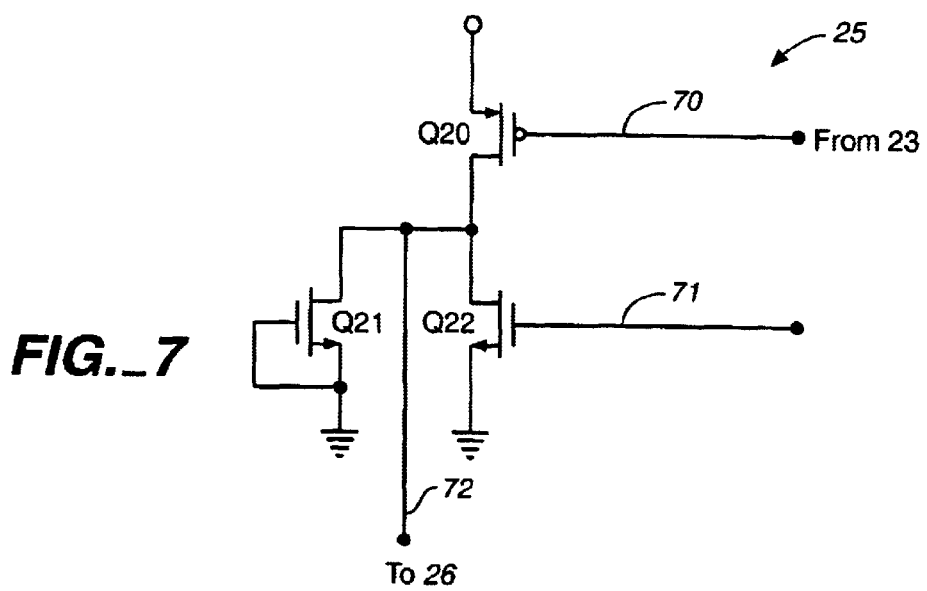
FIG._7

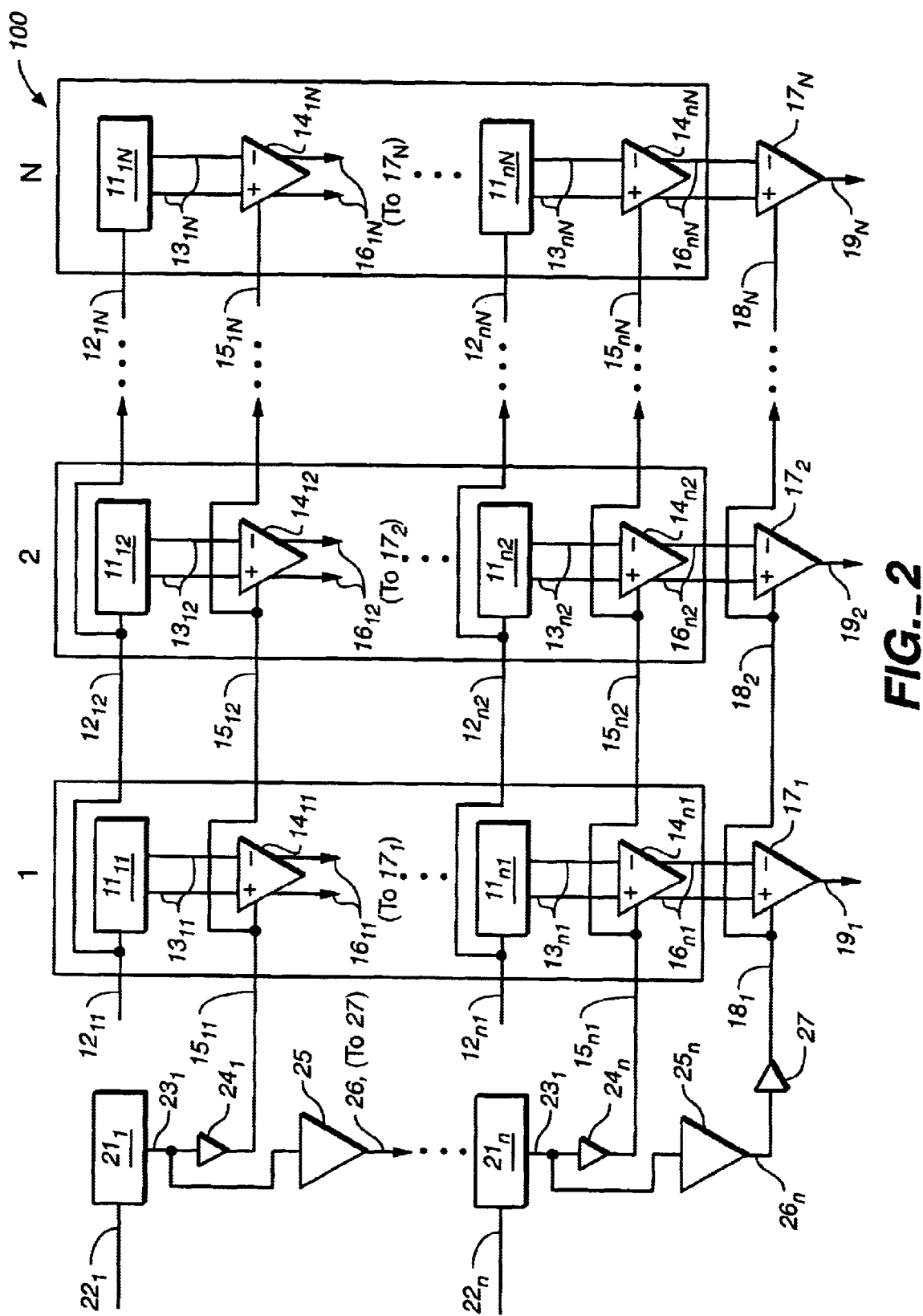
FIG._2

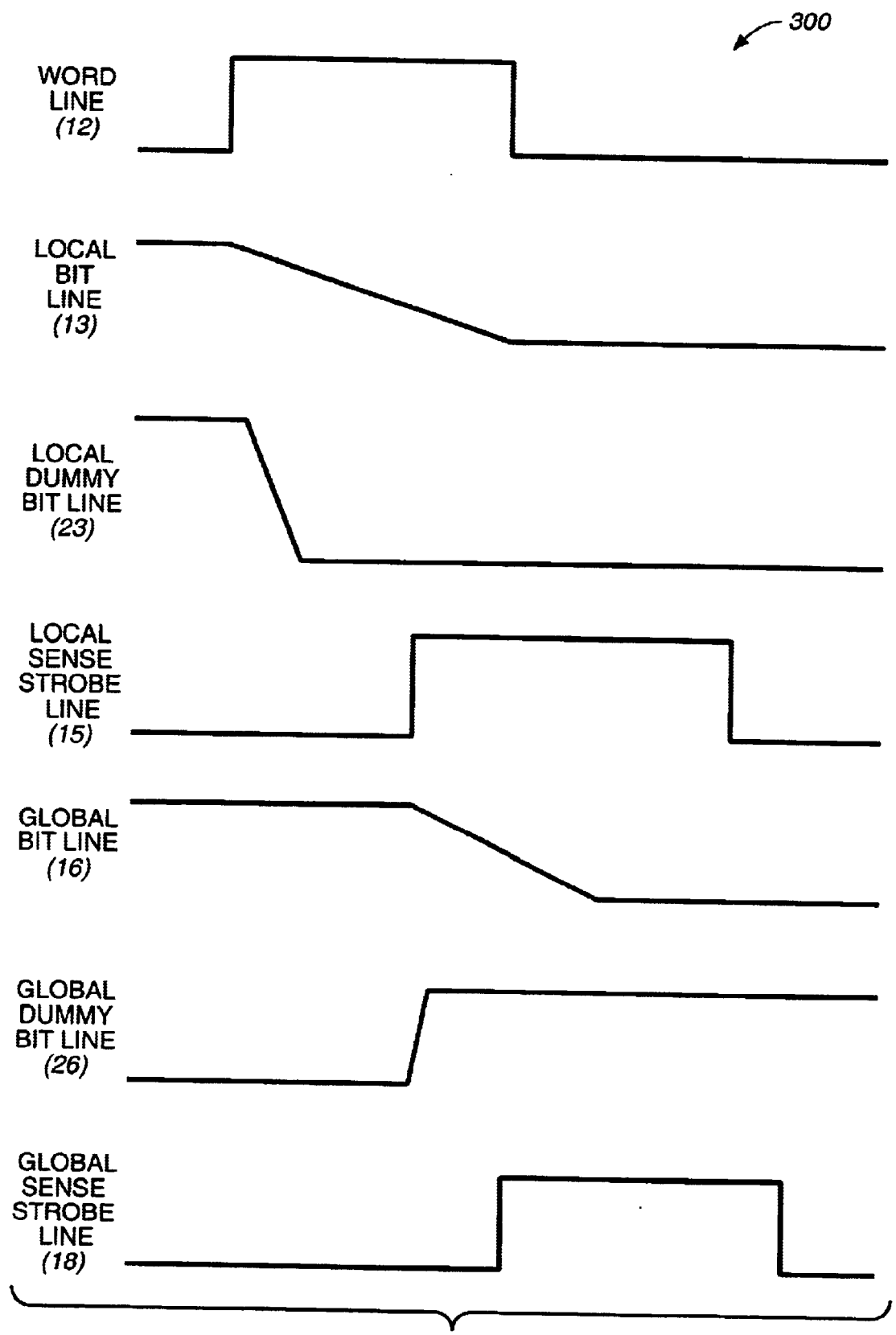
FIG._3

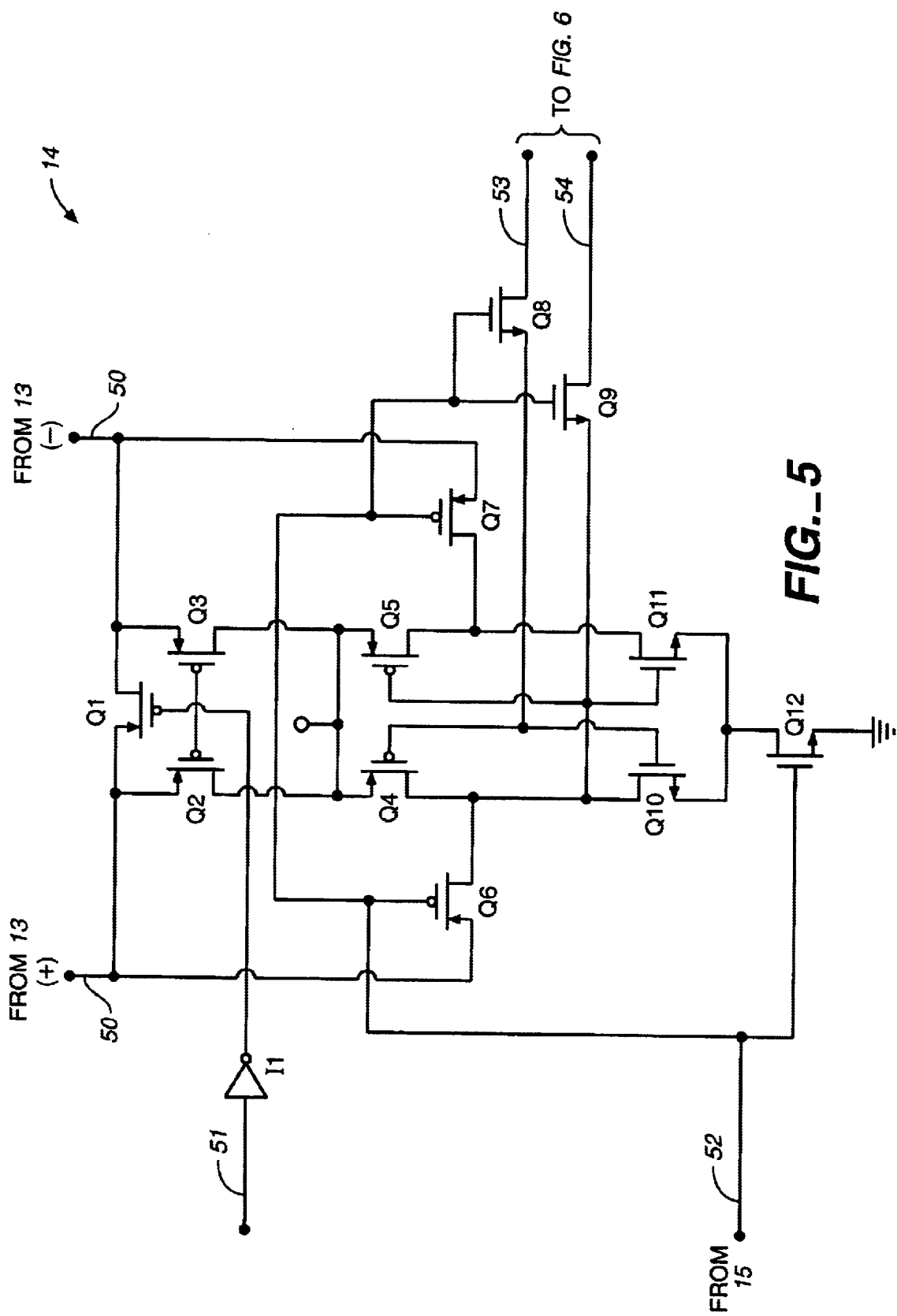
FIG._5

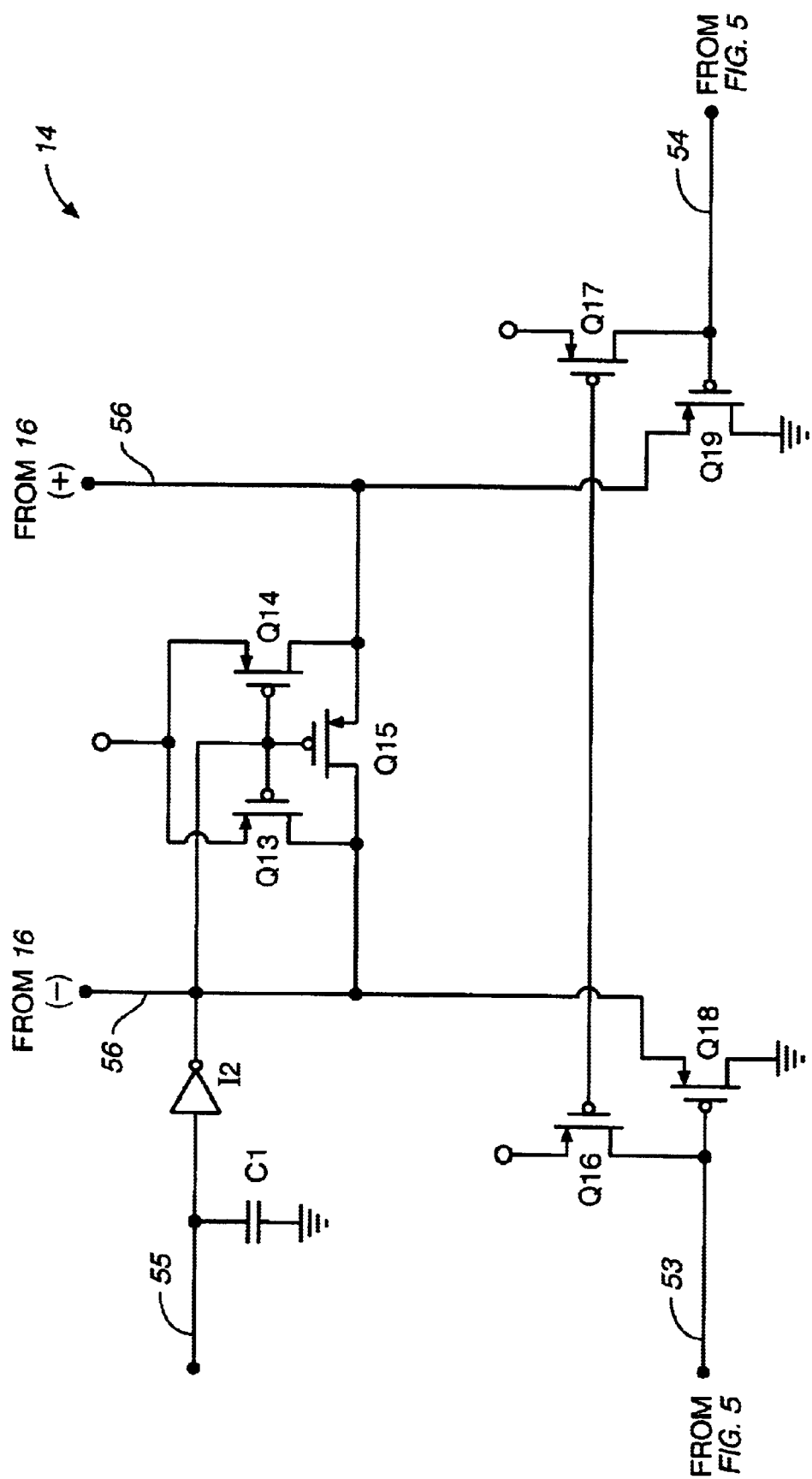
FIG._6

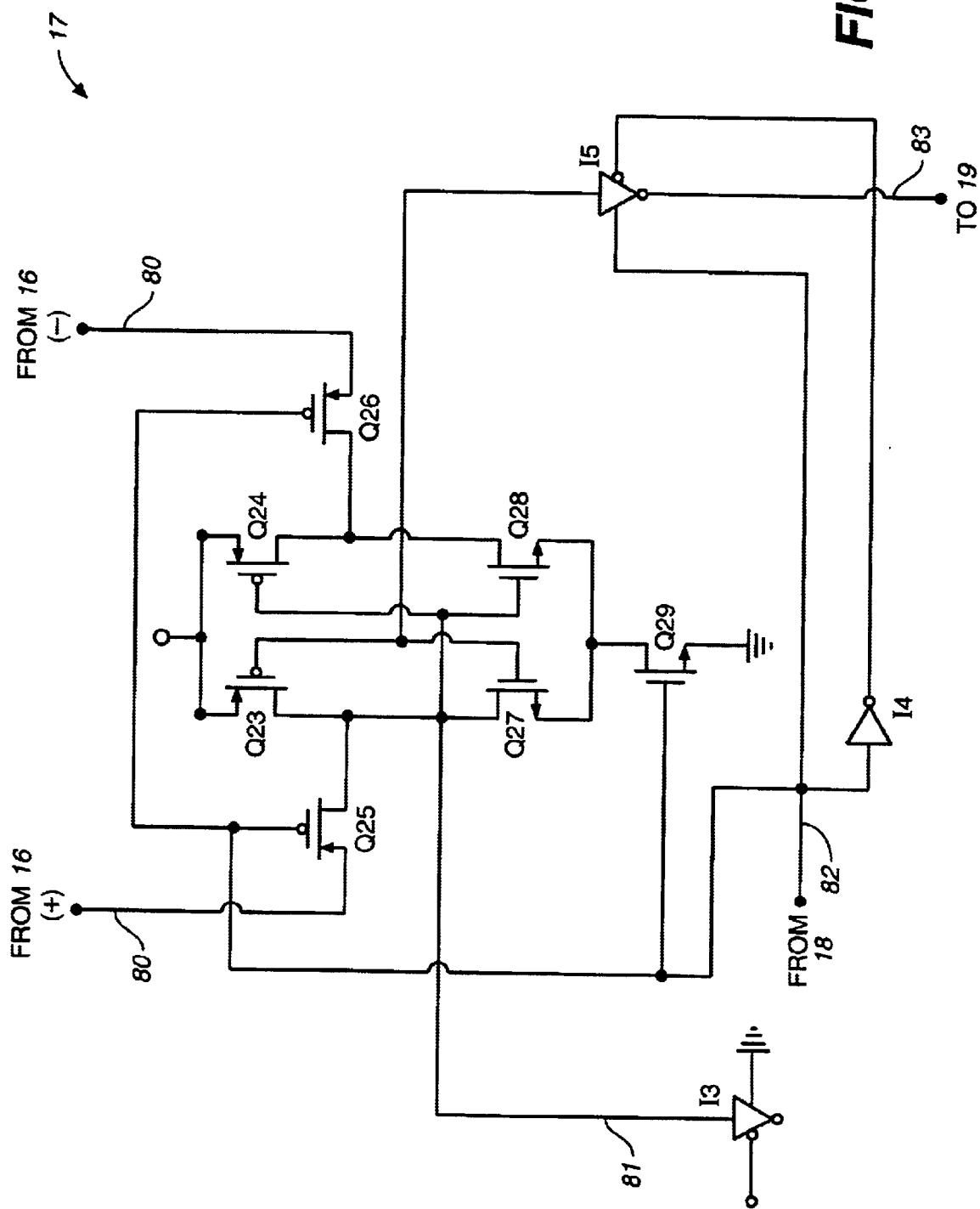
FIG._8

TIMING SCHEME FOR SEMICONDUCTOR MEMORY DEVICES

BACKGROUND OF THE INVENTION

1. Field of the Invention

The present invention generally relates to semiconductor memory devices, and more particularly, to a timing scheme for semiconductor memory devices which enables, among other things, rapid data access during a read operation.

2. Background Information

Recent semiconductor technology has developed highly-integrated, large-capacity semiconductor memory devices. Semiconductor memory devices are comprised of many individual memory cells arranged in an array. Each memory cell is typically adapted to store one bit of digital data. In a memory array, groups of individual memory cells are arranged in columns with the individual cells in each column connected together by two conductors, often referred to as local bit lines. A memory array may include many columns of memory cells, with each column including a pair of local bit lines.

The local bit lines of a given column of memory cells are typically connected in some manner to another pair of bit lines, often referred to as global bit lines. Global bit lines typically operate in conjunction with many pairs of local bit lines to enable communication of data from many columns of memory cells with other components, such as processors and/or other memory devices. Accordingly, the use of local and global bit lines is hierarchical in nature, and a memory device using such lines may be referred to as a segmented memory device.

In addition to local and global bit lines, each memory cell in a memory array is typically connected to a conductor referred to as a word line. The memory array includes a number of word lines, each word line commonly connecting memory cells in a row across the different columns. The word lines are used to activate an individual cell in a particular column for a read operation from the cell, or a write operation to the cell. Accordingly, word lines, local bit lines, and global bit lines operate together to facilitate data transfer in a segmented memory device.

In order for a segmented memory device to perform optimally, the device should employ a timing scheme that enables small voltage differentials to be sensed on the local and global bit lines. In particular, such a timing scheme provides advantages such as high speed data access since less time is required for a minimum voltage differential to develop on the bit lines during a read operation. Moreover, power consumption for the device is reduced since smaller voltages can be used. Accordingly, there is a need for such a timing scheme for semiconductor memory devices. The present invention addresses these and other issues.

SUMMARY OF THE INVENTION

In accordance with principles of the present invention, a semiconductor memory device includes at least one memory cell for storing digital data. A local sense amplifier is operably coupled to the at least one memory cell for receiving a first signal representative of the digital data stored in the at least one memory cell, and outputting a second signal representative of the received first signal in response to a first strobe signal. A global sense amplifier is operably coupled to the local sense amplifier for receiving the second signal, and outputting a third signal representative of the received second signal in response to a second strobe signal. Dummy circuitry is provided for enabling generation of the first and second strobe signals.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 1 is a diagram of an exemplary semiconductor device suitable for implementing the present invention;

FIG. 2 is a diagram showing further details of the memory of FIG. 1;

FIG. 3 is a diagram showing the timing relationship of signals in FIG. 2;

FIG. 4 is a diagram showing the relationship between certain voltages in FIG. 2;

FIG. 5 is a diagram showing exemplary details of a first stage of each local sense amplifier of FIG. 2;

FIG. 6 is a diagram showing exemplary details of a second stage of each local sense amplifier of FIG. 2;

FIG. 7 is a diagram showing exemplary details of each dummy sense amplifier of FIG. 2; and FIG. 8 is a diagram showing exemplary details of each global sense amplifier of FIG. 2.

The exemplifications set out herein illustrate preferred embodiments of the invention, and such exemplifications are not to be construed as limiting the scope of the invention in any manner.

DESCRIPTION OF THE PREFERRED EMBODIMENTS

Referring now to the drawings, and more particularly to FIG. 1, an exemplary semiconductor device 150 suitable for implementing the present invention is shown. As indicated in FIG. 1, the semiconductor device 150 is embodied as a "chip" and may represent a dedicated memory device, or alternatively, may represent another type of semiconductor device such as a microprocessor which includes a memory component. In any event, the semiconductor device 150 comprises at least one memory 100, such as a static random access memory (SRAM). For simplicity of explanation, the semiconductor device 150 is shown in FIG. 1 as including only the memory 100. However, in practice the semiconductor device 150 may also have additional components (not shown), such as additional memories, logic gates, etc. As indicated in FIG. 1, the memory 100 includes at least one input terminal and at least one output terminal to facilitate reading and writing operations. Although not expressly shown in FIG. 1, the memory 100 is preferably comprised of many individual memory cells arranged in an array of rows and columns, and each memory cell is capable of storing one bit of digital data.

Referring now to FIG. 2, a diagram providing further details of the memory 100 of FIG. 1 is shown. In particular, FIG. 2 shows a portion of the memory 100 sufficient to impart an understanding of the inventive principles of the present invention. The memory 100 of FIG. 2 is arranged as an array of rows (i.e., 1 to n) and columns (i.e., 1 to N). Accordingly, many of the elements shown in FIG. 2 include one or more subscripts indicating a row and/or column designation. However, to facilitate explanation, the elements of FIG. 2 will often be referred to herein without subscript(s).

As shown in FIG. 2, each of the columns (i.e., 1 to N) includes a plurality (i.e., n) of individual memory cells 11. As previously indicated, each memory cell 11 is capable of storing one bit of digital data. Although not expressly shown in FIG. 2, each memory cell 11 includes one or more input lines through which digital data is input to the memory cell 11. A word line 12 is electrically connected to each memory cell 11 in a given row, and when activated, enables operations such as a read operation from the row of memory cells 11, or a write operation to the row of memory cells 11. As will be discussed further herein, the present invention advantageously provides, among other things, a timing scheme which enables rapid data access during reading operations. Accordingly, the present invention will be described herein with a primary emphasis on reading operations.

A pair of local bit lines 13 are electrically connected to each memory cell 11. The local bit lines 13 provide an electrically conductive path through which digital data is output from a memory cell 11. In FIG. 2, a local sense amplifier 14 is electrically connected to each pair of local bit lines 13, and receives thereby a first signal from a corresponding memory cell 11 representative of the digital data stored therein. Although FIG. 2 shows a dedicated local sense amplifier 14 for each memory cell 11, it is recognized that a single local sense amplifier 14 may be used in conjunction with a plurality of memory cells 11. Accordingly, the number of local sense amplifiers 14 per column of memory cells 11 is a simply a matter of design choice, and may be varied as a performance/area trade-off.

A local sense strobe line 15 is electrically connected to each local sense amplifier 14 in a given row, and when activated, causes each local sense amplifier 14 in the row to output a second signal representative of the first signal received via the local bit lines 13. A pair of global bit lines 16 are electrically connected to each local sense amplifier 14, and provide an electrically conductive path through which the second signal is output from each local sense amplifier 14.

A global sense amplifier 17 is electrically connected to each pair of global bit lines 16 for a given column, and receives thereby the second signals output from the local sense amplifiers 14 in the column. A global sense strobe line 18 is electrically connected to each global sense amplifier 17, and when activated, causes each global sense amplifier 17 to output onto a corresponding data output line 19 a third signal representative of the second signal received via the global bit lines 16. The data output lines 19 may be connected to a device external to the memory 100, such as a processor or other device (not shown).

A dummy cell 21 is provided for each row of memory cells 11. Each dummy cell 21 stores an electrical charge, and when discharged outputs a fourth signal which enables the timing scheme according to principles of the present invention. According to an exemplary embodiment, each dummy cell 21 has the same, or approximately the same, drive current as each memory cell 11. A dummy word line 22 is electrically connected to each dummy cell 21, and when activated, causes the dummy cell 21 to output the fourth signal.

A local dummy bit line 23 is electrically connected to each dummy cell 21, and provides an electrically conductive path through which the fourth signal is output from each dummy cell 21. An inverting amplifier 24 is electrically connected to each local dummy bit line 23, and receives thereby the fourth signal output from the corresponding dummy cell 21.

In response to the fourth signal, the amplifier 24 generates and outputs a first strobe signal to each local sense amplifier 14 in a given row via the corresponding local sense strobe line 15.

A dummy sense amplifier 25 is also electrically connected to each local dummy bit line 23 and receives the fourth signal therefrom. In response to the fourth signal, the dummy sense amplifier 25 generates and outputs a fifth signal. A global dummy bit line 26 is electrically connected to each dummy sense amplifier 25 and provides an electrically conductive path through which the fifth signal is output from each dummy sense amplifier 25.

A non-inverting, simple amplifier 27 is electrically connected to each global dummy bit line 26 and receives thereby each of the fifth signals output from the dummy sense amplifiers 25. In response to the fifth signals, the amplifier 27 is triggered and outputs a second strobe signal to each global sense amplifier 17 via the global sense strobe line 18. The second strobe signal thereby causes each global sense amplifier 17 to output the third signal onto its corresponding data output line 19.

A read operation of the memory 100 will now be described with reference to FIGS. 2 through 4. FIG. 3 is a diagram showing the timing relationship of signals in FIG. 2, while FIG. 4 is a diagram showing the relationship between certain voltages in FIG. 2. Again, to facilitate explanation, the following description will be provided without reference to any particular subscripts. References will be made only to rows and/or columns, as necessary.

To initiate a read operation from a row of memory cells 11 of FIG. 2, a logic high (i.e., "1") signal is applied to the word line 12, as indicated in FIG. 3. This logic high signal is thereby provided to each memory cell 11 in the particular row being read. Although not expressly shown in FIG. 3, a logic high signal is also applied to the dummy word line 22 of the same row concurrently with the logic high signal on the word line 12. In response to the logic high signal on the word line 12, the memory cells 11 of the row each output the first signal on an applicable one of the local bit lines 13. According to an exemplary embodiment, both of the local bit lines 13 connected to a memory cell 11 are normally charged to a predetermined level. During a read operation, if the data being read from the memory cell 11 represents a logic high signal, then one of the local bit lines 13 is discharged while the other local bit line 13 maintains a charged state. Alternatively, if the data being read from the memory cell 11 represents a logic low signal (i.e., "0"), then the opposite local bit line 13 is discharged while the other local bit line 13 maintains a charged state. In any event, for each memory cell 11 of the row being read, one of its two local bit lines 13 is discharged while the other local bit line 13 remains charged in response to the logic high signal on the word line 12, as indicated in FIG. 3. The first signals are thereby applied to the corresponding local sense amplifiers 14.

As previously indicated, in order to read data from a given row of memory cells 11, a logic high signal is applied to the dummy word line 22 of the row concurrently with the logic high signal on the word line 12 of the row. In response to the logic high signal on the dummy word line 22, the corresponding dummy cell 21 is discharged and thereby outputs the fourth signal on the corresponding local dummy bit line 23, as indicated in FIG. 3. The fourth signal is applied to the corresponding amplifier 24 which is thereby triggered and outputs the first strobe signal to the corresponding row of local sense amplifiers 14 via the associated local sense strobe line 15, as indicated in FIG. 3.

The first strobe signal in turn causes each of the local sense amplifiers 14 of the row to output the second signal to its corresponding global sense amplifier 17 via the corresponding global bit lines 16. Like the local bit lines 13, both of the global bit lines 16 of a given pair are normally charged to a predetermined level. During a read operation, if the data being read out via the global bit lines 16 represents a logic high signal, then one of the global bit lines 16 of the pair is discharged while the other global bit line 16 remains charged. Alternatively, if the data being read represents a logic low signal (i.e., "0"), then the opposite global bit line 16 is discharged while the other global bit line 16 remains charged. In any event, one of the two global bit lines 16 for a given pair is discharged in response to the first strobe signal on the local sense strobe line 15, as indicated in FIG. 3.

The fourth signal is also applied to the corresponding dummy sense amplifier 25 via the corresponding local dummy bit line 23. In response to the fourth signal, the dummy sense amplifier 25 generates and outputs the fifth signal to the amplifier 27 via the global dummy bit line 26, as indicated in FIG. 3. In response to the fifth signal, the amplifier 27 is triggered and thereby outputs the second strobe signal to the global sense amplifiers 17 via the global sense strobe line 18, as indicated in FIG. 3. The second strobe signal thereby causes the global sense amplifiers 17 to output the third signals onto the data output lines 19.

FIG. 4 illustrates the relationship between certain voltages in FIG. 2. In particular, FIG. 4 shows the relationship between the voltage discharge on one of the local bit lines 13, and the voltage pull-up on the global dummy bit lines 26 during a read operation. As indicated in FIG. 4, the local bit line 13 has a voltage discharge $V_{DG}$ during a read operation having a time duration T. Also in FIG. 4, a voltage pull-up $V_{PU}$ on the global dummy bit lines 26 during the same time period T is equal to M times the voltage discharge $V_{DG}$, where M is equal to the number of pull down devices (i.e., local sense amplifiers 14) connected to the global bit lines 16.

In the aforementioned manner, the memory 100 provides a timing scheme which advantageously enables high speed data access during a read operation. Among other things, using dummy circuitry to enable generation of both the first and second strobe signals reduces the amount of time that is required for a minimum voltage differential to develop on the local and global bit lines 13 and 16 during a read operation. Accordingly, the present invention provides a timing scheme which allows data signals to be quickly transferred between segments of the memory 100 (i.e., from a local sense amplifier 14 to the corresponding global sense amplifier 17), and output for access.

Exemplary details of certain components of FIG. 2 are shown in FIGS. 5 through 8. In particular, FIGS. 5 through 8 illustrate examples of how the components of FIG. 2 may be constructed to enable a read operation according to principles of the present invention. It will be intuitive to those skilled in the art, however, that other designs for the components of FIG. 2 may be employed in accordance with principles of the present invention. Moreover, it will likewise be intuitive that the circuitry of FIGS. 5 through 8 may be modified to facilitate write operations.

Referring to FIG. 5, a diagram providing details of a first stage of each local sense amplifier 14 of FIG. 2 is shown. As shown in FIG. 5, the first stage of each local sense amplifier 14 includes electrically conductive leads 50 through 54, transistors Q1 through Q12, and an inverter I1. The leads 50 represent the positive and negative input terminals of the local sense amplifier 14, and are electrically connected to the local bit lines 13 for receiving the first signal. The lead 51 is a pre-charge line (including the inverter 11) which provides a charging signal to the gate junctions of the transistors Q1 through Q3. The lead 52 is an input terminal electrically connected to the local sense strobe line 15 for receiving the first strobe signal. Leads 53 and 54 are terminals providing a connection to a second stage of the local sense amplifier 14, which will be described later herein with reference to FIG. 6.

The transistors Q1 through Q12 are embodied as metal oxide semiconductor field-effect transistors (MOSFETs). As indicated in FIG. 5, both p-type MOSFETs and n-type MOSFETs are included. In particular, transistors Q1 through Q7 are embodied as p-type MOSFETs, and transistors Q8 through Q12 are embodied as n-type MOSFETs. Moreover, transistors Q1 through Q7 include inverters at their gate junctions.

As shown in FIG. 5, the positive lead 50 is electrically connected to the source junctions of the transistors Q1, Q2 and Q6. The negative lead 50 is electrically connected to the source junctions of the transistors Q3 and Q7, and the drain junction of the transistor Q1. The lead 51 is electrically connected to the gate junctions of the transistors Q1 through Q3, and provides the pre-charge signal thereto. The drain junctions of the transistors Q2 and Q3 are electrically connected to one another,.and are also connected to the source junctions of the transistors Q4 and Q5, respectively. The source junctions of the transistors Q4 and Q5 are electrically connected to one another.

The drain junction of the transistor Q4 is electrically connected to the drain junctions of the transistors Q6 and Q10, the gate junctions of the transistors Q5 and Q11, and the source junction of the transistor Q9. The gate junction of the transistor Q4 is electrically connected to the gate junction of the transistor Q10, the drain junctions of the transistors Q5 and Q11, and the source junction of the transistor Q8.

The drain junction of the transistor Q5 is electrically connected to the drain junctions of the transistors Q7 and Q11, the gate junctions of the transistors Q4 and Q10, and the source junction of the transistor Q8. The gate junction of the transistor Q5 is electrically connected to the gate junction of the transistor Q11, the drain junctions of the transistors Q4 and Q10, and the source junction of the transistor Q9.

The lead 52 is electrically connected to the gate junctions of the transistors Q6 through Q9 and Q12, and provides the first strobe signal thereto. The leads 53 and 54 are electrically connected to the drain junctions of the transistors Q8 and Q9, respectively. The source junctions of the transistors Q10 and Q11 are electrically connected to one another, and are also connected to the drain junction of the transistor Q12. The source junction of the transistor Q12 is connected to ground.

In operation, the circuitry of FIG. 5 functions as follows. At the beginning of a read cycle, the pre-charge line 51 is disabled, which causes transistors Q1, Q2 and Q3 to be turned off. As a differential signal is developed on the local bit lines 13, that signal is conveyed to transistors Q4, Q5, Q10, Q11 and Q12 by transistors Q6 and Q7. When the first strobe signal is received from the local sense strobe line 15 on lead 52, the transistor Q12 is turned on and the transistors Q6 and Q7 are turned off. In turn, the differential signal received via the local bit lines 13 is conveyed through transistors Q8 and Q9 onto leads 53 and 54.

Referring to FIG. 6, a diagram providing details of a second stage of each local sense amplifier 14 of FIG. 2 is shown. As shown in FIG. 6, the second stage of each local sense amplifier 14 includes electrically conductive leads 53 through 56, transistors Q13 through Q19, an inverter I2, and a capacitor C1. As previously indicated herein, the leads 53 and 54 electrically connect the first and second stages of the local sense amplifier 14. According to an exemplary embodiment, the lead 53 represents a signal line, which when activated, terminates a read operation. Conversely, the lead 54 represents a signal line, which when activated, causes a read operation to be performed. The lead 55 is a pre-charge line (including the capacitor C1 and the inverter I2) which provides a charging signal to the gate junctions of the transistors Q13 through Q15. The leads 56 are output terminals electrically connected to the global bit lines 16 for transmitting the second signal to the global sense amplifier 17.

The transistors Q13 through Q19 are embodied as MOSFETs, and more specifically p-type MOSFETs. Moreover, transistors Q13 through Q19 include inverters at their gate junctions.

As shown in FIG. 6, the lead 53 is electrically connected to the drain junction of the transistor Q16, and the gate junction of the transistor Q18. Similarly, the lead 54 is electrically connected to the drain junction of the transistor Q17, and the gate junction of the transistor Q19. The lead 55 is electrically connected to the gate junctions of the transistors Q13 through Q15, and provides the pre-charge signal thereto. The source junctions of the transistors Q13 and Q14 are electrically connected to one another, while the drain junctions of the transistors Q13 and Q15 are electrically connected to one another. The drain junction of the transistor Q14 is electrically connected to the source junction of the transistor Q15.

The gate junctions of the transistors Q16 and Q17 are electrically connected to one another, while their source junctions are unconnected. The drain junctions of the transistors Q18 and O19 are connected to ground. The negative lead 56 is electrically connected to the drain junctions of the transistors Q13 and Q15, and the source junction of the transistor Q18. The positive lead 56 is electrically connected to the drain junction of the transistor Q14, and the source junctions of the transistors Q15 and Q19.

In operation, the circuitry of FIG. 6 functions as follows. At the beginning of a read cycle, the pre-charge line 55 is disabled, which in turn causes transistors Q13, Q14 and Q15 to be turned off. The transistors Q16 and Q17 are also turned off. As a signal is provided from the first stage of the local sense amplifier 14 (i.e., FIG. 5), one of the leads 53 or 54 will discharge. This turns on one of the transistors Q18 or Q19, and creates a differential signal on leads 56 which is passed onto the global bit lines 16.

Referring to FIG. 7, a diagram providing further details of each dummy sense amplifier 25 of FIG. 2 is shown. As shown in FIG. 7, each dummy sense amplifier 25 includes electrically conductive leads 70 through 72, and transistors Q20 through Q22. The lead 70 is electrically connected to the corresponding local dummy bit line 23 and receives the fourth signal therefrom. The lead 71 is a pre-charge line. The lead 72 is electrically connected to the corresponding global dummy bit line 26 and outputs the fifth signal thereto.

The transistors Q20 through Q22 are also embodied as MOSFETs. In particular, transistor Q20 is embodied as a p-type MOSFET, and transistors Q21 and Q22 are embodied as n-type MOSFETs. Moreover, transistor Q20 includes an inverter at its gate junction.

As shown in FIG. 7, the leads 70 and 71 are both electrically connected to the gate junctions of the transistors Q20 and Q22. The lead 72 is electrically connected to the drain junctions of the transistors Q20 through Q22. The source junction of the transistor Q20 is unconnected, while the source junction of the transistor Q22 is connected to ground. The gate and source junctions of the transistor Q21 are commonly connected to ground.

In operation, the circuitry of FIG. 7 functions as follows. At the beginning of a read cycle, the transistor Q22 is turned off by a pre-charge signal on lead 71. When the fourth signal is received on lead 70 from the corresponding local dummy bit line 23, the transistor Q20 is turned on thus pulling up the voltage on the lead 72 and causing the fifth signal to be output onto the corresponding global dummy bit line 26.

Referring to FIG. 8, a diagram providing further details of each global sense amplifier 17 of FIG. 2 is shown. As shown in FIG. 8, each global sense amplifier 17 includes electrically conductive leads 80 through 83, transistors Q23 through Q29, and inverters I3 through I5. The leads 80 represent the positive and negative input terminals of the global sense amplifier 17, and are electrically connected to the global bit lines 16 for receiving the second signal. The lead 81 is a line (including the tri-state inverter I3) which is provided to balance the voltage levels within the global sense amplifier 17. The lead 82 is an input terminal electrically connected to the global sense strobe line 18 for receiving the second strobe signal. Lead 83 is an output terminal for providing the third signal to the data output line 19.

The transistors Q23 through Q29 are also embodied as MOSFETs. In particular, transistors Q23 through Q26 are embodied as p-type MOSFETs, and transistors Q27 through Q29 are embodied as n-type MOSFETs. Moreover, transistors Q23 through Q26 include inverters at their gate junctions.

As shown in FIG. 8, the positive lead 80 is electrically connected to the source junction of the transistor Q25. The negative lead 80 is electrically connected to the source junction of the transistor Q26. The source junctions of the transistors Q23 and Q24 are electrically connected to one another. The gate junction of the transistor Q23 is electrically connected to the drain junctions of the transistors Q24, Q26 and Q28, the gate junction of the transistor Q27, and the inverter I5. The drain junction of the transistor Q23 is electrically connected to the drain junctions of the transistors Q25 and Q27, the gate junctions of the transistors Q24 and Q28, and the inverter I3.

The gate junction of the transistor Q24 is electrically connected to drain junctions of the transistors Q23, Q25 and Q27, the gate junction of the transistor Q28, and the inverter I3. The drain junction of the transistor Q24 is electrically connected to the drain junctions of the transistors Q26 and Q28, the gate junctions of the transistors Q23 and Q27, and the tri-state inverter I5. The gate junction of the transistor Q25 is electrically connected to the gate junctions of the transistors Q26 and Q29, and the inverters I4 and I5. The source junctions of the transistors Q27 and Q28 are electrically connected to one another, and the drain junction of the transistor Q29. The source junction of the transistor Q29 is connected to ground.

In operation, the circuitry of FIG. 8 functions as follows. During a read cycle, the global bit lines 16 will develop a differential signal as a result of transistors Q18 and Q19 of FIG. 6. This signal is conveyed to transistors Q23, Q24, Q27, Q28 and Q29 via transistors Q25 and Q26. When the second strobe signal is received on lead 82 from the global sense strobe line 18, transistor Q29 is thereby turned on while transistors Q25 and Q26 are turned off. The signal previously conveyed to transistors Q23, Q24, Q27, Q28 and Q29 is then passed to lead 83 through inverter I5, and output onto data output line 19.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A semiconductor memory device, comprising:
   at least one memory cell for storing digital data;
   a local sense amplifier operably coupled to the at least one memory cell for receiving a first signal representative of the digital data stored in the at least one memory cell, and outputting a second signal representative of the received first signal in response to a first strobe signal;
   a global sense amplifier operably coupled to the local sense amplifier for receiving the second signal, and outputting a third signal representative of the received second signal in response to a second strobe signal; and
   dummy circuitry for enabling generation of the first and second strobe signals the dummy circuitry having a dummy cell for outputting a fourth signal and a first amplifier for outputting the first strobe signal in dependence upon the fourth signal.

2. The semiconductor memory device of claim 1, wherein:
   the at least one memory cell is electrically connected to a word line, and outputs the first signal when the word line is activated;
   the dummy cell is electrically connected to a dummy word line, and outputs the fourth signal when the dummy word line is activated; and
   the word line and the dummy word line are activated concurrently.

3. The semiconductor memory device of claim 1, wherein the dummy circuitry further comprises:
   a dummy sense amplifier for outputting a fifth signal in dependence upon the fourth signal; and
   a second amplifier for outputting the second strobe signal in dependence upon the fifth signal.

4. The semiconductor memory device of claim 3, wherein:
   the at least one memory cell is electrically connected to a word line, and outputs the first signal when the word line is activated;
   the dummy cell is electrically connected to a dummy word line, and outputs the fourth signal when the dummy word line is activated; and
   the word line and the dummy line are activated concurrently.

5. A method for operating a semiconductor memory device, comprising steps of:
   outputting a first signal from a memory cell to a local sense amplifier, the first signal representing digital data stored in the memory cell;
   outputting a second signal from the local sense amplifier to a global sense amplifier in response to a first strobe signal, the second signal representing the first signal;
   outputting a third signal from the global sense amplifier to a data output line in response to a second strobe signal, the third signal representing the second signal;
   outputting a fourth signal from a dummy cell of dummy circuitry that enables generation of the first and second strobe signals; and
   outputting the first strobe signal in dependence upon the fourth signal.

6. The method of claim 5, wherein:
   the at least one memory cell is electrically connected to a word line, and outputs the fist signal when the word line is activated;
   the dummy cell is electrically connected to a dummy word line, and outputs the fourth signal when the dummy word line is activated; and
   the word line and the dummy word line are activated concurrently.

7. The method of claim 5, wherein the dummy circuitry includes a dummy sense amplifier, and further comprising:
   outputting a fifth signal from the dummy sense amplifier in dependence upon the fourth signal; and
   outputting the second strobe signal in dependence upon the fifth signal.

8. The method of claim 7, wherein:
   the at least one memory is electrically connected to a word line, and outputs the first signal when the word line is activated;
   the dummy cell is electrically connected to a dummy word line, and outputs the fourth signal when the dummy word line is activated; and
   the word line and the dummy word line are activated concurrently.

9. A semiconductor memory device having a plurality of rows and columns, the device comprising:
   a plurality of memory cells;
   a plurality of local sense amplifiers, each being operably coupled to at least one of the memory cells for receiving a first signal therefrom, and outputting a second signal representative of the receive first signal in response to a first strobe signal;
   a plurality of global sense amplifiers, each being operably coupled to at least one of the local sense amplifiers for receiving the second signal therefrom, and outputting a third signal representative of the received second signal in response to a second strobe signal; and
   dummy circuitry for enabling generation of the first and second strobe signals, the dummy circuitry having a dummy cell for outputting a fourth signal, and a first amplifier for outputting the first strobe signal in dependence upon the fourth signal.

10. The semiconductor memory device of claim 9, wherein:
    each of the memory cells is electrically connected to a word line, and outputs the first signal when the word line is activated;
    each of the dummy cells is electrically connected to a dummy word line, and outputs the fourth signal when the dummy word line is activated; and
    the word line and the dummy word line corresponding to one of the rows are activated concurrently.

11. The semiconductor memory device of claim 9, wherein the dummy circuitry further comprises:
    a plurality of dummy sense amplifiers, each for outputting a fifth signal in dependence upon the corresponding fourth signal; and a second amplifier for outputting the second strobe signal in dependence upon the fifth signals.

12. The semiconductor memory device of claim 11, wherein:

each of the memory cells is electrically connected to a word line, and outputs the first signal when the word line is activated;

each of the dummy cells is electrically connected to a dummy word line, and outputs the fourth signal when the dummy word line is activated; and the word line and the dummy word line corresponding to one of the rows are activated concurrently.

* * * * *